US 9,474,115 B2

(12) United States Patent
Chang et al.

(10) Patent No.: US 9,474,115 B2
(45) Date of Patent: Oct. 18, 2016

(54) DIMMING CIRCUIT

(71) Applicant: Lextar Electronics Corporation, Hsinchu (TW)

(72) Inventors: Chun-Jong Chang, Hsinchu County (TW); Po-Shen Chen, Hsinchu (TW); Jhao-Cyuan Huang, New Taipei (TW); Chien-Nan Yeh, Kaohsiung (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/062,178

(22) Filed: Mar. 6, 2016

(65) Prior Publication Data

US 2016/0278173 A1    Sep. 22, 2016

(30) Foreign Application Priority Data

Mar. 18, 2015    (TW) .............. 104108630 A

(51) Int. Cl.
*H05B 33/08*    (2006.01)
*H03K 5/08*    (2006.01)

(52) U.S. Cl.
CPC ............ *H05B 33/0815* (2013.01); *H03K 5/08* (2013.01)

(58) Field of Classification Search
CPC .......... H05B 33/0815; H05B 33/0812; H05B 33/0851; H05B 33/0833; H05B 33/0845; H05B 33/0848; H05B 33/0818; H05B 37/02; H05B 37/029; H05B 41/28; H05B 20/347; Y02B 20/346
USPC .................... 315/291, 294, 224, 312
See application file for complete search history.

(56) References Cited

U.S. PATENT DOCUMENTS

| | | | | |
|---|---|---|---|---|
| 7,746,300 B2* | 6/2010 | Zhang | ................ | H05B 33/0818 315/291 |
| 8,810,156 B2* | 8/2014 | Brassfield | .......... | H05B 33/0818 315/291 |
| 2015/0237694 A1* | 8/2015 | Zudrell-Koch | .... | H05B 33/0815 315/307 |
| 2016/0119994 A1* | 4/2016 | Chen | ................ | H05B 33/0851 307/31 |

FOREIGN PATENT DOCUMENTS

| | | |
|---|---|---|
| CN | 101742756 A | 6/2010 |
| CN | 102196619 A | 9/2011 |
| CN | 103687163 A | 3/2014 |
| TW | 201412185 A | 3/2014 |

* cited by examiner

*Primary Examiner* — Haissa Philogene
(74) *Attorney, Agent, or Firm* — CKC & Partners Co., Ltd.

(57) ABSTRACT

A dimming circuit is disclosed herein. The dimming circuit includes a control voltage receiving module and a driving module. The control voltage receiving module is configured to output a reference voltage according to a control voltage. The driving module is electrically connected to the control voltage receiving module, in which the driving module includes a driving transistor, a first transistor and a feedback circuit. The driving transistor is configured to provide a driving current to drive a lighting module. The first transistor is configured to control the driving transistor with feedback according to the reference voltage. The feedback circuit is electrically connected between the driving transistor and the first transistor and configured to determine the operating state of the first transistor according to the driving current.

21 Claims, 6 Drawing Sheets

DIMMING CIRCUIT

RELATED APPLICATIONS

This application claims priority to Taiwanese Patent Application Serial Number 104108630, filed Mar. 18, 2015, the content of which is herein incorporated by reference.

BACKGROUND

1. Technical Field

The present disclosure is related to a dimming circuit. More particularly, the present disclosure is related to a dimming circuit for a light emitting diode.

2. Description of Related Art

In recent times, due to the advantages of the light emitting diode such as high efficiency, and ability of energy saving, light emitting diodes have replaced traditional lighting sources in many applications and have become an important area of research.

The dimming circuit of a light emitting diode nowadays uses an operational amplifier during the dimming process. Please refer to FIG. 6, which is the characteristic curve of an output voltage Vo versus an input voltage Vi of an operational amplifier. As shown in FIG. 6, when the input voltage Vi is lower than a threshold voltage VT1 or higher than a threshold voltage VT2, the output voltage Vo is equal to the saturated voltage −Vsat or the saturated voltage Vsat, respectively. In other words, the operational amplifier is in the linear working region only when the input voltage Vi is within the range between the threshold voltage VT1 and the threshold voltage VT2, and it is in the non-linear working region either when the input voltage Vi is too high or too low. When the operational amplifier operates in the non-linear working region, the dimming circuit is not capable of properly control the light emitting diode, resulting in problems such as light source flickering and control failure.

Accordingly, ways in which to improve the structure of the existing dimming circuit are important research issues and urgent objects in the relevant field.

SUMMARY

To solve the above-mentioned problem, an aspect of the present disclosure is a dimming circuit. The dimming circuit includes a control voltage receiving module and a driving module. The control voltage receiving module is configured to output a reference voltage according to a control voltage. The driving module is electrically connected to the control voltage receiving module, in which the driving module includes a driving transistor, a first transistor, and a feedback circuit. The driving transistor is configured to provide a driving current to drive a lighting module. The first transistor is configured to control the driving transistor according to the reference voltage. The feedback circuit is electrically connected between the driving transistor and the first transistor, and is configured to determine an operating state of the first transistor according to the driving current.

In an embodiment of the present disclosure, a first terminal of the driving transistor is electrically connected to the lighting module, and a second terminal of the driving transistor is electrically connected to the feedback circuit. A first terminal of the first transistor is electrically connected to a control terminal of the driving transistor; a second terminal of the first transistor is electrically connected to the control voltage receiving module; and a control terminal of the first transistor is electrically connected to the feedback circuit. The feedback circuit determines the operating state of the first transistor according to an electric level of the control terminal of the first transistor, which is controlled by the driving current.

In an embodiment of the present disclosure, the feedback circuit includes a first diode unit, in which a first terminal of the first diode unit is electrically connected to the driving transistor.

In an embodiment of the present disclosure, the feedback circuit further includes a first resistor and a second resistor. A first terminal of the first resistor is electrically connected to the second terminal of the driving transistor, and a second terminal of the first resistor is electrically connected to the control terminal of the first transistor. A first terminal of the second resistor is electrically connected to the second terminal of the first resistor. The first terminal of the first diode unit is electrically connected to the first terminal of the first resistor, and a second terminal of the first diode unit is electrically connected to a second terminal of the second resistor.

In an embodiment of the present disclosure, the driving module further includes a load circuit, in which the load circuit is electrically connected to the feedback circuit and is configured to determine a minimum value of the driving current.

In an embodiment of the present disclosure, the load circuit includes a third resistor, in which a first terminal of the third resistor is electrically connected to the second terminal of the second resistor, and a second terminal of the third resistor is electrically connected to a ground terminal.

In an embodiment of the present disclosure, the driving module further includes a fourth resistor and a fifth resistor. A first terminal of the fourth resistor is electrically connected to the second terminal of the first transistor, and a second terminal of the fourth resistor is electrically connected to the ground terminal. A second terminal of the fifth resistor is electrically connected to the control terminal of the driving transistor.

In an embodiment of the present disclosure, the control voltage receiving module includes a second transistor and a third transistor. The second transistor is configured to provide the reference voltage. The third transistor is configured to determine an electric level at a control terminal of the second transistor, in which a first terminal of the third transistor is electrically connected to a control terminal of the second transistor, and a second terminal of the third transistor is electrically connected to the ground terminal.

In an embodiment of the present disclosure, the control voltage receiving module further includes a sixth resistor, in which a second terminal of the sixth resistor is electrically connected to the first terminal of the third transistor.

In an embodiment of the present disclosure, a control terminal of the third transistor is configured to receive the control voltage, and a second terminal of the second transistor is configured to provide the reference voltage.

In an embodiment of the present disclosure, the control voltage receiving module further includes a slope control circuit configured to control the third transistor, so as to adjust a slope of a characteristic curve of the driving current versus the control voltage.

In an embodiment of the present disclosure, the slope control circuit includes a voltage divider circuit configured to control an electric level at the control terminal of the third transistor.

In an embodiment of the present disclosure, the voltage divider circuit includes a seventh resistor and a eighth resistor. A first terminal of the seventh resistor is configured to receive the control voltage, and a second terminal of the seventh resistor is electrically connected to the control terminal of the third transistor. A first terminal of the eighth resistor is electrically connected to the second terminal of the seventh resistor, and a second terminal of the eighth resistor is electrically connected to the ground terminal.

In an embodiment of the present disclosure, the control voltage receiving module further includes a voltage clamping circuit. The voltage clamping circuit is electrically connected to the voltage divider circuit, and is configured to output a clamping voltage to the voltage divider circuit according to the control voltage, so that the voltage divider circuit controls the electric level at the control terminal of the third transistor according to the clamping voltage.

In an embodiment of the present disclosure, the voltage clamping circuit includes a first voltage regulation unit and a fifth transistor. The first voltage regulation unit is configured to provide the clamping voltage. A first terminal of the fifth transistor is electrically connected to a first terminal of the first voltage regulation unit, and a control terminal of the fifth transistor is configured to receive the control voltage.

In an embodiment of the present disclosure, the voltage clamping circuit includes a tenth resistor, in which a second terminal of the tenth resistor is electrically connected to the first terminal of the first voltage regulation unit.

In an embodiment of the present disclosure, the dimming circuit further includes a voltage regulator module. The voltage adjusting module is electrically connected to the control voltage receiving module and the driving module, and is configured to output a second dimming rectified voltage to the control voltage receiving module and the driving module according to a first dimming rectified voltage.

In an embodiment of the present disclosure, the voltage adjusting module includes a ninth resistor and a second voltage regulation unit. A first terminal of the ninth resistor is configured to receive the first dimming rectified voltage, and a first terminal of the second voltage regulation unit is electrically connected to a second terminal of the ninth resistor.

In an embodiment of the present disclosure, the voltage adjusting module is further configured to output the second dimming rectified voltage according to the first dimming rectified voltage and a transistor voltage, and the voltage adjusting module further includes a fourth transistor. A first terminal of the fourth transistor is electrically connected to the first terminal of the second voltage regulation unit and the second terminal of the ninth resistor. A control terminal of the fourth transistor is configured to receive the transistor voltage. A second terminal of the fourth transistor is electrically connected to the control voltage receiving module and the driving module.

In an embodiment of the present disclosure, the voltage adjusting module further includes a second diode. The second diode is electrically connected between the ninth resistor and the second voltage regulation unit.

In an embodiment of the present disclosure, the dimming circuit further includes a dimmer and a rectifying module. The dimmer is configured receive an AC voltage and output a dimming signal. The rectifying module is electrically connected to the dimmer and the voltage regulator module, and is configured to output the first dimming rectified voltage according to the dimming signal.

Accordingly, in the present disclosure, the operating state of the first transistor is determined by the feedback circuit according to the driving current, thereby achieving a linear dimming for a light emitting diode. The technical solutions of the disclosure, as compared to the prior art, have obvious advantages and achieve beneficial effects. By the above-mentioned technical solutions, significant technical progress can be achieved, which can be extensively used industrially.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
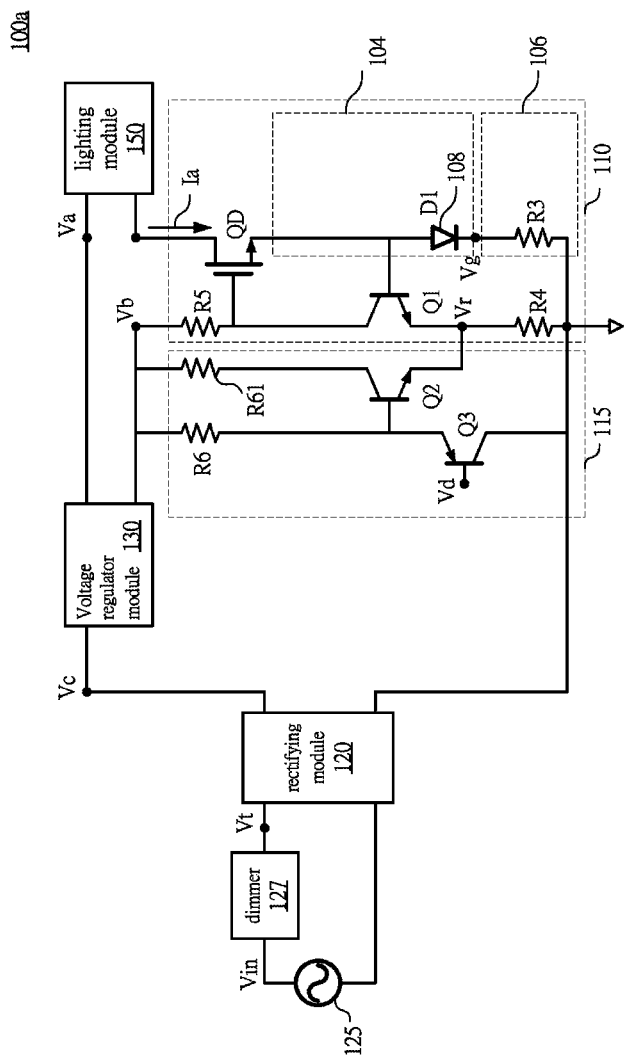
FIG. 1 is a schematic diagram of a dimming circuit according to an embodiment of the present disclosure.

Several aspects of the present disclosure can be better understood by the following detailed description with reference to the embodiments and the accompanying figures. However, the provided embodiments are not intended to limit the scope of the present disclosure, and the description of the operation is not intended to limit the processing order. Any equivalent device created by any combination of elements is within the scope of the present disclosure. Further, in accordance with the industrial standards and practices, the figures are of assistance in explaining and not drawn to scale. Dimensions of various features may be arbitrarily increased or decreased for the ease of description. Through out the description, the same element is labeled with same reference numeral for better understanding.

Unless specifically indicated, terms used through out the specification and claims each have their ordinary meaning as used in this field, in the content of this disclosure, or in special context. Some terms used in the present disclosure would be individually discussed hereinafter, providing further guidance toward the present disclosure for persons having ordinary skills in the art.

Further, as used herein, terms such as "include", "comprise", "have", "contain" all have open-ended meanings, i.e. meaning "include . . . but not limited thereto". Further, as used herein, "and/or" includes any and all combination of the listed items.

As used herein, "connected" or "coupled" means "electrically connected" or "electrically coupled". "Connected" or "coupled" can also be used to describe the cooperation or interaction between two or more elements. Further, although "first" and "second" are used herein to describe certain elements, these terms are used merely for distinguishing elements or processes that are named by the same terminology. Unless specifically indicated in the context, these terms are not used for indicating or implying the order or priority, and are not used for limiting the scope of the present disclosure.

Please refer to FIG. 1. FIG. 1 is a schematic diagram of a dimming circuit 100a according to an embodiment of the present disclosure. In the present embodiment, the dimming circuit 100a includes a dimmer 127, a rectifying module 120, a voltage adjusting module 130, a control voltage receiving module 115 and a driving module 110.

Structurally, the dimmer 127 is electrically connected to a power source 125. The rectifying module 120 is electrically connected to the dimmer 127 and the voltage adjusting module 130. The voltage adjusting module 130 is electrically connected to the control voltage receiving module 115, the driving module 110 and a lighting module 150. The control voltage receiving module 115 is electrically connected to the driving module 110. The driving module 110 is electrically connected to the lighting module 150.

In the present embodiment, the dimmer 127 is configured to receive an AC voltage Vin from the power source 125 and to correspondingly output a dimming signal Vt. Specifically, the dimmer 127 may be a phase-chopping dimmer, which may be realized by a switching device such as a triode for alternating current (TRIAC). The phase-chopping dimmer chops a part of the AC voltage Vin through delayed trigger and correspondingly outputs the dimming signal Vt.

The rectifying module 120 is configured to rectify the dimming signal Vt, so as to correspondingly output a dimming rectified voltage Vc. The voltage adjusting module 130 is configured to adjust the dimming rectified voltage Vc to a proper voltage level, so as to output a dimming rectified voltage Vb to the control voltage receiving module 115 and the driving module 110. Further, the voltage adjusting module 130 is configured to output a driving voltage Va to the lighting module 150.

The lighting module 150 may include a driving circuit and a light emitting diode (LED), in which the driving circuit is configured to drive the light emitting diode so as to illuminate. The brightness of the light emitting diode depends on the driving voltage Va and the driving current Ia provided to the lighting module 150.

It is noted that, in some embodiments, a DC voltage from a power supply may be provided as the dimming rectified voltage Vb to the control voltage receiving module 115 and the driving module 110 in the dimming circuit 100a. The present disclosure is not limited to the embodiment shown in FIG. 1.

In the present embodiment, the control voltage receiving module 115 is configured to output a corresponding reference voltage Vr according to the control voltage Vd. The driving module 110 adjusts the value of the driving current Ia passing through the lighting module 150 according to the reference voltage Vr and the dimming rectified voltage Vb, so as to control the brightness of the lighting module 150. For example, the control voltage Vd may be a DC voltage signal ranging between about 0 to 10 Volts, about 0 to 12 Volts, or a DC voltage signal of other value.

As a result, the dimming circuit 100a may dim the lighting module 150 according to the control voltage Vd. The particular circuit structure and detailed operation mode of the control voltage receiving module 115 and the driving module 110 will be described in detail in the following paragraphs.

First, the driving module 110 includes a driving transistor QD, a first transistor Q1, a feedback circuit 104, a load circuit 106, a resistor R4, and a resistor R5. As shown in FIG. 1, the driving transistor QD may be realized by a metal-oxide-semiconductor field-effect transistor (MOSFET) and the first transistor Q1 may be realized by a bipolar junction transistor (BJT). However, the present disclosure is not limited thereto. Persons having ordinary skills in the art may freely choose among a MOSFET, a BJT, or an insulated gate bipolar transistor (IGBT), a high electron mobility transistor (HEMT), a heterojunction bipolar transistor (HBT), or other proper semiconductor devices, all of which are possible embodiments of the present disclosure.

In the present embodiment, the driving transistor QD is configured to provide a driving current Ia to drive the lighting module 150. The first terminal (e.g. drain terminal) of the driving transistor QD is electrically connected to the lighting module 150, and the second terminal (e.g. source terminal) of the driving transistor QD is electrically connected to the feedback circuit 104.

The first terminal (e.g. collector terminal) of the first transistor Q1 is electrically connected to a control terminal (e.g. gate terminal) of the driving transistor QD. The second terminal (e.g. emitter terminal) of the first transistor Q1 is electrically connected to the control voltage receiving module 115 to receive the reference voltage Vr. The control terminal (e.g. base terminal) of the first transistor Q1 is electrically connected to the feedback circuit 104. Further, the feedback circuit 104 is electrically connected to the load circuit 106.

The first terminal of the resistor R4 is electrically connected to the second terminal of the first transistor Q1, and the second terminal of the resistor R4 is electrically connected to the ground terminal. The first terminal of the resistor R5 is configured to receive the dimming rectified voltage Vb, and the second terminal of the resistor R5 is electrically connected to the control terminal of the driving transistor QD.

Because the feedback circuit 104 is electrically connected between the driving transistor QD and the first transistor Q1, the feedback circuit 104 may control the voltage at the control terminal (i.e. base terminal voltage) of the first transistor Q1 according to the driving current Ia flowing into the feedback circuit 104, so as to determine the operating state of the first transistor Q1. In the present embodiment, the feedback circuit 104 includes a diode unit 108, in which the diode unit 108 includes a diode D1.

In other words, the first transistor Q1 determines the collector current of the first transistor Q1 according to the value of the control terminal voltage and the reference voltage Vr. As a result, with the cooperation of the dimming rectified voltage Vb and the resistor R5, the first transistor Q1 may control the control terminal voltage of the driving transistor QD in feedback according to the reference voltage Vr, and in turn, adjusts the operating state of the driving transistor QD in feedback.

Therefore, as long as the initial voltage at control terminal (e.g. base terminal) of the first transistor Q1 is greater than the threshold voltage of the first transistor Q1, the driving module 110, with the cooperation of the driving transistor QD, the first transistor Q1, and the feedback circuit 104, may make the feedback voltage Vg (i.e. cathode terminal voltage of the diode D1) follow the reference voltage Vr.

The first terminal of the load circuit 106 is configured to receive the feedback voltage Vg, and the second terminal of the load circuit 106 is electrically connected to the ground terminal. As a result, the load circuit 106 may generate the driving current Ia according to the feedback voltage Vg.

Specifically, the load circuit 106 includes a resistor R3. In practice, the resistor R3 may be configured to determine the minimum value of the driving current Ia. The greater the resistance of the resistor R3 is, the smaller the driving current Ia is, provided that the feedback voltage Vg is kept constant. As a result, the upper limit of the current flowing through the lighting module 150 may be determined by selecting a proper resistance value for the resistor R3, thereby achieving the effect of limiting the maximum power of the lighting module 150 and avoiding the lighting module 150 from damaging due to overflow.

In the present embodiment, the reference voltage Vr is generated by the control voltage receiving module 115 according to the control voltage Vd and is outputted to the driving module 110. Specifically, the control voltage receiving module 115 includes a second transistor Q2, a third transistor Q3, a resistor R6, and a resistor R61. As shown in FIG. 1, the second transistor Q2 and the third transistor Q3 may be realized by a bipolar junction transistor (BJT), but the present disclosure is not limited thereto. Persons having ordinary skills in the art may freely choose among a MOSFET, a BJT, or an insulated gate bipolar transistor (IGBT), a high electron mobility transistor (HEMT), a heterojunction bipolar transistor (HBT), or other proper semiconductor devices, all of which are possible embodiments of the present disclosure.

As shown in FIG. 1, the first terminal of the resistor R6 is configured to receive the dimming rectified voltage Vb. The second terminal of the resistor R6 is electrically connected to the first terminal (e.g. emitter terminal) of the third transistor Q3. Similarly, the first terminal of the resistor R61 is configured to receive the dimming rectified voltage Vb.

The first terminal (e.g. collector terminal) of the second transistor Q2 is electrically connected to the second terminal of the resistor R61. The second terminal of the second transistor Q2 is electrically connected to the driving module 110, and is configured to provide the reference voltage Vr.

The first terminal (e.g. emitter terminal) of the third transistor Q3 is electrically connected to the control terminal (e.g. base terminal) of the second transistor Q2, and the second terminal (e.g. collector terminal) of the third transistor Q3 is electrically connected to the ground terminal. The control terminal (e.g. base terminal) of the third transistor Q3 is configured to receive the control voltage Vd.

According to the received control voltage Vd, the third transistor Q3, with the cooperation of the resistor R6, determines the electric level at the control terminal (e.g. base terminal) of the second transistor Q2, so as to adjust the operating state of the second transistor Q2. According to its operating state and with the cooperation of the resistor R61, the second transistor Q2, at the second terminal of the second transistor Q2, outputs the corresponding reference voltage Vr to the driving module 110.

Accordingly, with the cooperation of the above-mentioned circuit elements, the control voltage receiving module 115 may transform the control voltage Vd into a controllable current signal, and output the corresponding reference voltage Vr to the driving module 110 according to the control voltage Vd. Through the above-mentioned circuit structure, the driving module 110 adjusts the driving current Ia according to reference voltage Vr and by way of voltage negative feedback, so as to control the brightness of the lighting module 150, thereby achieving the linear dimming function.

Figure 2:
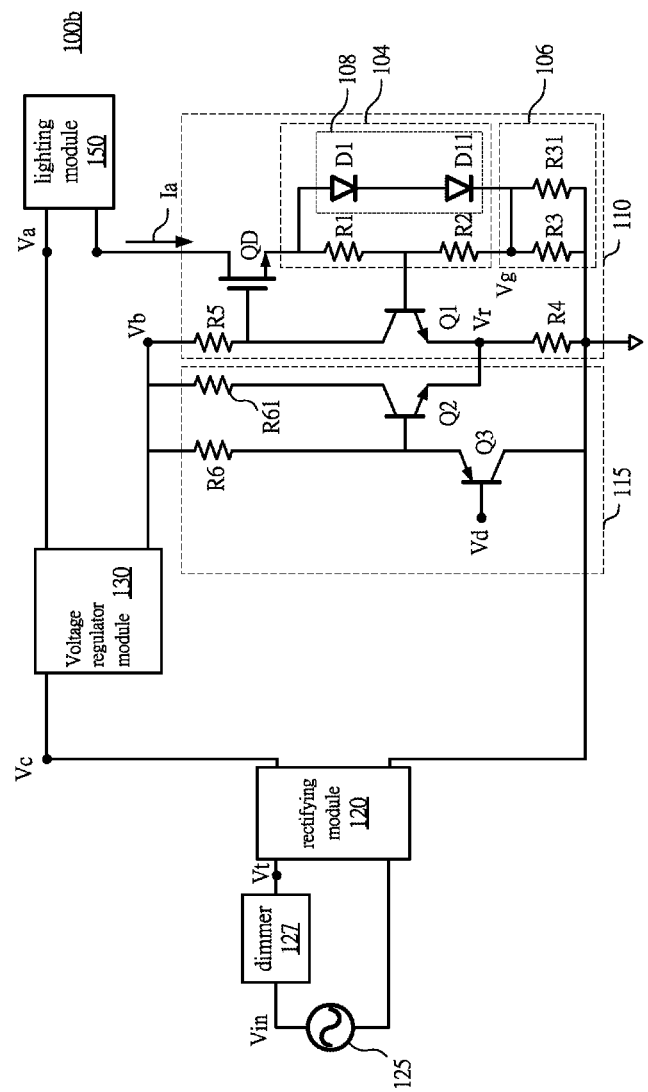
FIG. 2 is a schematic diagram of a dimming circuit according to an embodiment of the present disclosure.

Please refer to FIG. 2. FIG. 2 is a schematic diagram of a dimming circuit 100b according to another embodiment of the present disclosure. The present embodiment discloses another possible realization of the feedback circuit 104 and the load circuit 106. In the present embodiment, the feedback circuit 104 includes a resistor R1, a resistor R2, and a diode unit 108. Structurally, the first terminal of the resistor R1 is electrically connected to the second terminal of the driving transistor QD, and the second terminal of the resistor R1 is electrically connected to the control terminal of the first transistor Q1. The first terminal of the resistor R2 is electrically connected to the second terminal of the resistor R1. The first terminal of the diode unit 108 is electrically connected to the first terminal of the resistor R1, and the second terminal of the diode unit 108 is electrically connected to the second terminal of the resistor R2.

It is noted that the diode unit 108 may be realized in several different ways. As shown in FIG. 2, in some embodiments, the diode unit 108 may include a plurality of diodes D1, D11 connected in series, but the present disclosure is not limited thereto. In other embodiment, as shown in FIG. 1, the diode unit 108 may be realized by a single diode D1.

Similar to the embodiment shown in FIG. 1, in the present embodiment, the feedback circuit 104 is electrically connected between the driving transistor QD and the first transistor Q1, and controls the control terminal voltage (i.e., base terminal voltage) of the first transistor Q1 according to the driving current Ia flowing into the feedback circuit 104 and with the cooperation of resistors R1, R2, thereby determining the operating state of the first transistor Q1. Through the operation of the feedback circuit 104, the feedback voltage Vg may thus follow the reference voltage Vr, and in turn adjust the driving current Ia, so as to control the brightness of the lighting module 150. The specific details of the operation are disclosed in the above paragraphs and thus are not repeated here.

Further, in the present embodiment, the load circuit 106 includes a resistor R3 and a resistor R31. The first terminal of the resistor R3 is electrically connected to the second terminal of the resistor R2; the second terminal of the resistor R3 is electrically connected to the ground terminal; the first terminal of the resistor R31 is electrically connected to the cathode of the diode D11; and the second terminal of the resistor R31 is electrically connected to the ground terminal. Further, the resistor R31 and the resistor R3 are electrically connected in parallel.

It is noted that the load circuit 106 may be designed in accordance with the actual needs. For example, the load circuit 106 may be realized by a single resistor, or may be realized by a plurality of resistors connected in series or in parallel. Persons having ordinary skills in the art may make any modification or adjustment without departing from the spirit and scope of the present disclosure. The circuit structure shown in FIG. 2 is just an example, and the present disclosure is not limited thereto.

Figure 3:
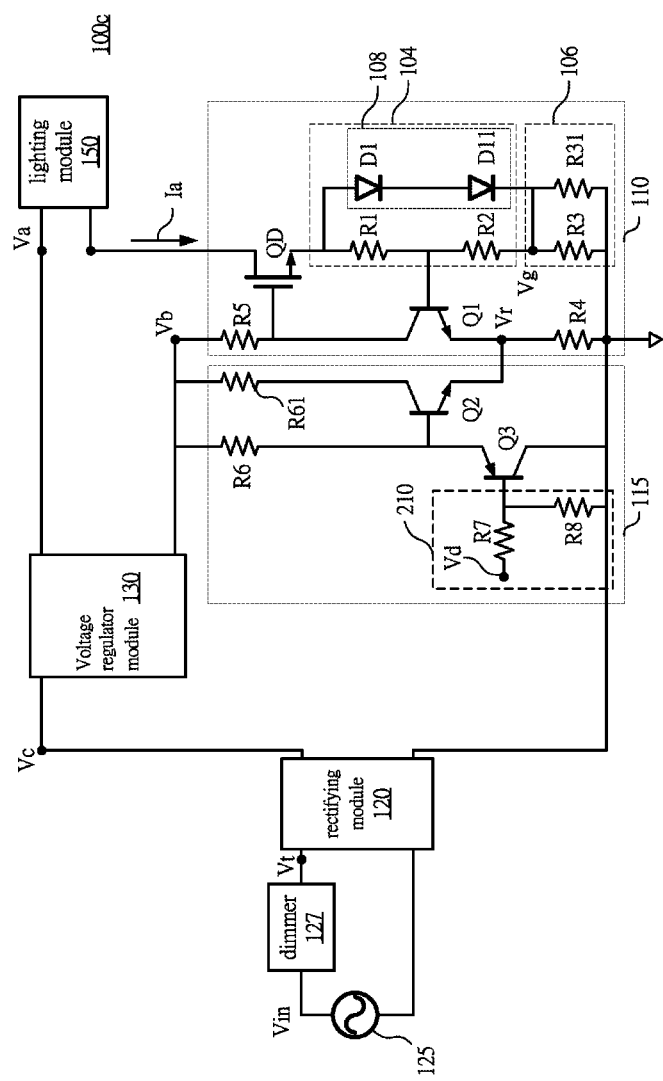
FIG. 3 is a schematic diagram of a dimming circuit according to an embodiment of the present disclosure.

Please refer to FIG. 3. FIG. 3 is a schematic diagram of a dimming circuit 100c according to another embodiment of the present disclosure.

In the present embodiment, the control voltage receiving module 115 further includes a slope control circuit 210. The slope control circuit 210 is configured to control the third transistor Q3, i.e. to adjust the electric level at the control terminal of the third transistor Q3, thereby controlling the slope of the characteristic curve of driving current Ia versus control voltage Vd.

For example, the slope control circuit 210 includes a voltage divider circuit, which is configured to adjust the control terminal electric level of third transistor Q3. As shown in FIG. 3, the voltage divider circuit includes a resistor R7 and a resistor R8. The first terminal of the resistor R7 is configured to receive the control voltage Vd, and the second terminal of the resistor R7 is electrically connected to the control terminal of the third transistor Q3. The first terminal of the resistor R8 is electrically connected to the second terminal of the resistor R7, the second terminal of the resistor R8 is electrically connected to the ground terminal.

As compared to the embodiment shown in FIG. 2, in the present embodiment, the control terminal electric level of the third transistor Q3 is controlled by the control voltage Vd through voltage divider of resistors R7 and R8. As a result, by properly changing the ratio between the resistances of the resistors R7 and R8, the ratio of the control voltage Vd to the control terminal electric level of the third transistor Q3 may be adjusted, and in turn the relationship between the control voltage Vd and the driving current Ia may be adjusted, causing change in brightness of the LED in the lighting module 150.

In other words, in the present embodiment, the control voltage receiving module 115, through the slope control circuit 210 realized by the voltage divider circuit, controls the slope of the characteristic curve of driving current Ia versus control voltage Vd. Because of the slope control circuit 210, the dimming circuit 100c may dim the lighting module 150 with more flexibility, allowing the brightness of the lighting module 150 to be more subtly changed.

Figure 4:
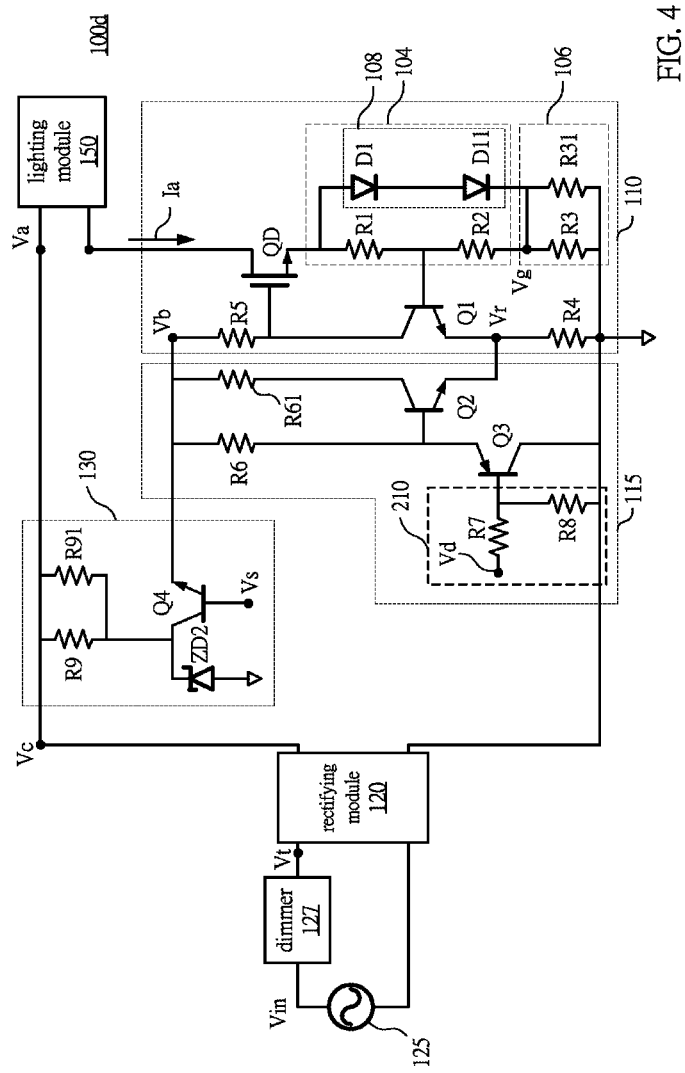
FIG. 4 is a schematic diagram of a dimming circuit according to an embodiment of the present disclosure.

Please refer to FIG. 4. FIG. 4 is a schematic diagram of a dimming circuit 100d according to another embodiment of the present disclosure.

In the present embodiment, the voltage adjusting module 130 includes a resistor R9, a second voltage regulation unit ZD2 and a fourth transistor Q4. The first terminal of the resistor R9 is configured to receive the dimming rectified voltage Vc, and the first terminal of the second voltage regulation unit ZD2 is electrically connected to the second terminal of the resistor R9. In some embodiments, the voltage adjusting module 130 further includes a resistor R91 connected in parallel with the resistor R9.

The first terminal of the fourth transistor Q4 is electrically connected to the first terminal of the second voltage regulation unit ZD2 and the second terminal of the resistor R9. The control terminal of the fourth transistor Q4 is configured to receive a switching voltage Vs. The second terminal of the fourth transistor Q4 is electrically connected to the control voltage receiving module 115 and the driving module 110, and is configured to provide the dimming rectified voltage Vb.

When the switching voltage Vs is smaller than the threshold voltage of the fourth transistor Q4, the fourth transistor Q4 is switched off, and the operation of the control voltage receiving module 115 and the driving module 110 is terminated to ensure that the driving current Ia will not flow through the lighting module 150. On the other hand, when the switching voltage Vs is greater than the threshold voltage of the fourth transistor Q4, the fourth transistor Q4 is turned on and outputs the dimming rectified voltage Vb to the control voltage receiving module 115 and the driving module 110.

Specifically, as shown in FIG. 4, the second voltage regulation unit ZD2 may be realized by a Zener Diode. The reverse breakdown voltage of the Zener diode poses a limit on the value of the dimming rectified voltage Vb, and in turn, limits the value of the control terminal voltage of the driving transistor QD, preventing the control terminal voltage of the driving transistor QD from exceeding the safe limit. As a result, the voltage adjusting module 130 outputs the dimming rectified voltage Vb according to the dimming rectified voltage Vc and the switching voltage Vs.

Figure 5:
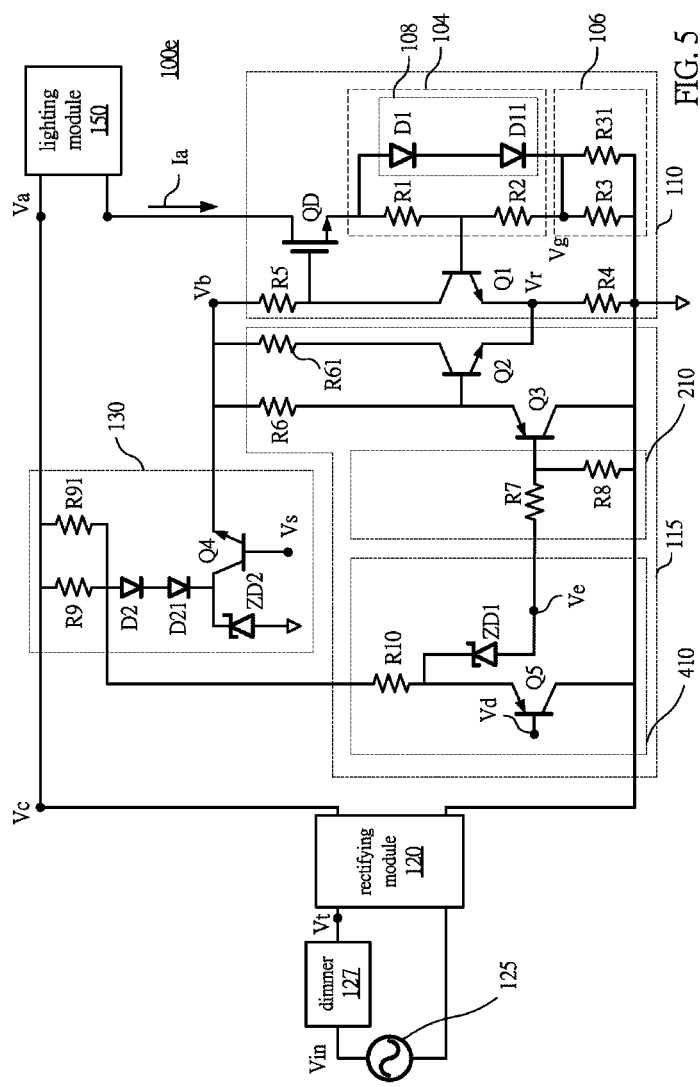
FIG. 5 is a schematic diagram of a dimming circuit according to an embodiment of the present disclosure.
Figure 6:
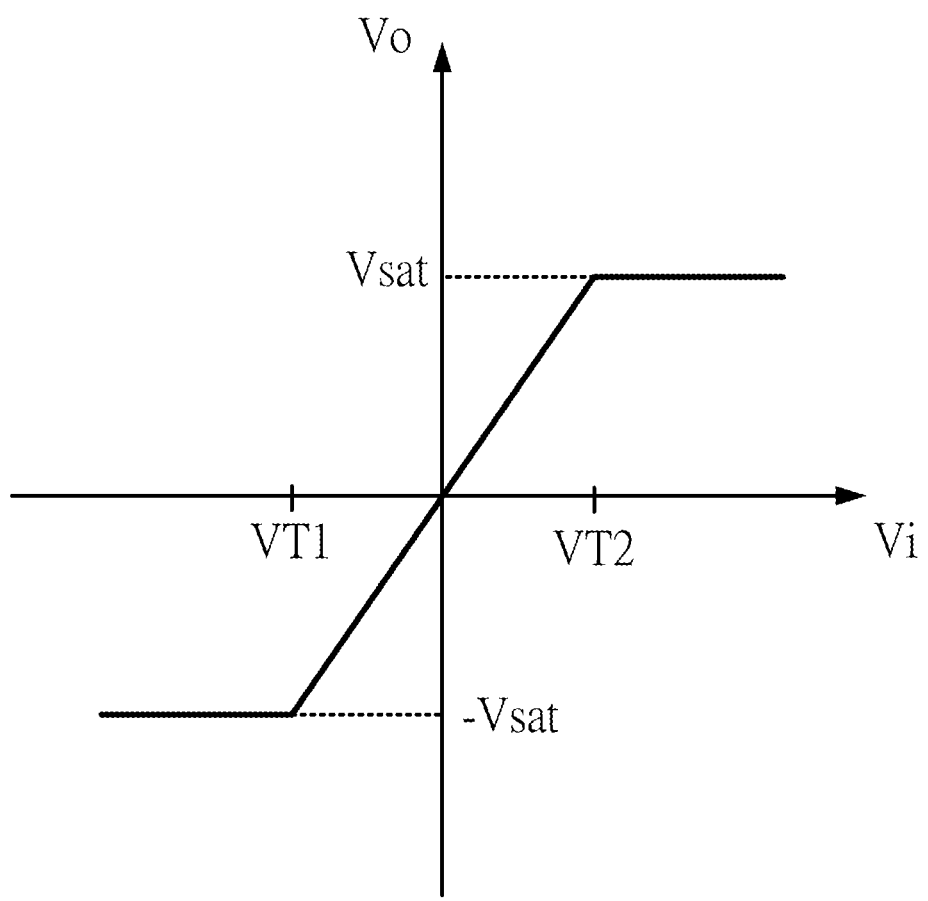
FIG. 6 is a characteristic curve of output voltage versus input voltage of an operational amplifier.

Please refer to FIG. 5. FIG. 5 is a schematic diagram of a dimming circuit 100e according to another embodiment of the present disclosure. In the present embodiment, the control voltage receiving module 115 further includes a voltage clamping circuit 410. The voltage clamping circuit 410 is electrically connected to the slope control circuit 210, and is configured to output a clamping voltage Ve to the slope control circuit 210 according to the control voltage Vd, so that the slope control circuit 210 controls the control terminal electric level of the third transistor Q3 according to the clamping voltage Ve.

Specifically, in the present embodiment, the voltage clamping circuit 410 includes a first voltage regulation unit ZD1, a fifth transistor Q5 and a resistor R10. The fifth transistor Q5 may be realized by a bipolar junction transistor (BJT), but the present disclosure is not limited thereto. Persons having ordinary skills in the art may freely choose among a MOSFET, a BJT, or an insulated gate bipolar transistor (IGBT), a high electron mobility transistor (HEMT), a heterojunction bipolar transistor (HBT), or other proper semiconductor devices, all of which are possible embodiments of the present disclosure. The first voltage regulation unit ZD1 may be realized by a Zener diode. The reverse breakdown voltage of the Zener diode is provided as the clamping voltage Ve. The first terminal (e.g. emitter terminal) of the fifth transistor Q5 is electrically connected to the first terminal (e.g. negative terminal) of the first voltage regulation unit ZD1, and the control terminal (e.g. base terminal) of the fifth transistor Q5 is configured to receive the control voltage Vd. The first terminal of the resistor R10 is electrically connected to the second terminal of the resistor R9 in the voltage adjusting module 130, and the second terminal of the resistor R10 is electrically connected to the first terminal (e.g. negative terminal) of the first voltage regulation unit ZD1.

The voltage clamping circuit 410 may determine the threshold voltage of the dimming circuit 100e by properly selecting the reverse breakdown voltage of the first voltage regulation unit ZD1, so that when the control voltage Vd is smaller than the threshold voltage, the brightness of the lighting module 150 is kept unchanged.

In the present embodiment, the voltage adjusting module 130 further includes a diode D2. The diode D2 is electrically connected between the resistor R9 and the second voltage regulation unit ZD2. Further, the voltage adjusting module 130 may be designed in accordance with the actual needs. For example, as shown in FIG. 5, the voltage adjusting module 130 may be a plurality of diodes D2, D21 connected in series between the resistor R9 and the second voltage regulation unit ZD2. It is noted that any person having ordinary skills in the art may make any modification or adjustment without departing from the spirit and scope of the present disclosure. The circuit structure shown in FIG. 5 is just an example, and the present disclosure is not limited thereto.

As a result, when the control voltage Vd is increased, the diodes D2, D21 may provide a voltage drop, so that the dimming rectified voltage Vb is limited under the safe limit of the driving transistor QD. In other words, with the help of the voltage drop provided by the diodes D2, D21, the maximum operational value of the control voltage Vd may be increased, thereby creating a wider operation range for the control voltage Vd and improving the dimming ability of the dimming circuit 100e.

The present disclosure, as applied in the above-mentioned embodiments, determines the operating state of the first transistor by the feedback circuit and according to the driving current, thereby achieving the linear dimming for a light emitting diode. The technical solutions of the disclosure, as compared to the prior art, have obvious advantages and achieve beneficial effects. By the above-mentioned technical solutions, significant technical progress may be achieved, which may be extensively used industrially.

Further, in some embodiments, with the cooperation of functional block circuits such as the voltage regulator module, the voltage clamping circuit, the slope control circuit, and the load circuit, the dimming properties of the dimming circuit may be correspondingly controlled. For example, the threshold voltage, the degree of change of the dimming, and current limit may be determined, so as to change the brightness of the lighting module with more flexibility to fulfill the actual need.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations may be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A dimming circuit, comprising:
a control voltage receiving module configured to output a reference voltage according to a control voltage; and
a driving module electrically connected to the control voltage receiving module, the driving module comprising:
a driving transistor configured to provide a driving current to drive a lighting module;
a first transistor configured to control the driving transistor with feedback according to the reference voltage; and
a feedback circuit electrically connected between the driving transistor and the first transistor, the feedback circuit being configured to determine an operating state of the first transistor according to the driving current.

2. The dimming circuit of claim 1, wherein a first terminal of the driving transistor is electrically connected to the lighting module, and a second terminal of the driving transistor is electrically connected to the feedback circuit;
a first terminal of the first transistor is electrically connected to a control terminal of the driving transistor, a second terminal of the first transistor is electrically connected to the control voltage receiving module, and a control terminal of the first transistor is electrically connected to the feedback circuit;
the feedback circuit controls an electric level at the control terminal of the first transistor according to the driving current, so as to determine the operating state of the first transistor.

3. The dimming circuit of claim 1, wherein the feedback circuit comprises:
a first diode unit, wherein a first terminal of the first diode unit is electrically connected to the driving transistor.

4. The dimming circuit of claim 3, wherein the feedback circuit further comprises:
a first resistor, wherein a first terminal of the first resistor is electrically connected to a second terminal of the driving transistor, and a second terminal of the first resistor is electrically connected to a control terminal of the first transistor; and
a second resistor, wherein a first terminal of the second resistor is electrically connected to the second terminal of the first resistor;
wherein the first terminal of the first diode unit is electrically connected to the first terminal of the first resistor, and a second terminal of the first diode unit is electrically connected to a second terminal of the second resistor.

5. The dimming circuit of claim 4, wherein the driving module further comprises:
a load circuit electrically connected to the feedback circuit, the load circuit being configured to determine a minimum value of the driving current.

6. The dimming circuit of claim 5, wherein the load circuit comprises:
a third resistor, wherein a first terminal of the third resistor is electrically connected to the second terminal of the second resistor, and a second terminal of the third resistor is electrically connected to a ground terminal.

7. The dimming circuit of claim 6, wherein the driving module further comprises:
a fourth resistor, wherein a first terminal of the fourth resistor is electrically connected to the second terminal of the first transistor, and a second terminal of the fourth resistor is electrically connected to the ground terminal; and
a fifth resistor, wherein a second terminal of the fifth resistor is electrically connected to a control terminal of the driving transistor.

8. The dimming circuit of claim 1, wherein the control voltage receiving module comprises:
a second transistor configured to provide the reference voltage; and
a third transistor configured to determine an electric level at a control terminal of the second transistor, wherein a first terminal of the third transistor is electrically connected to a control terminal of the second transistor, and a second terminal of the third transistor is electrically connected to a ground terminal.

9. The dimming circuit of claim 8, wherein the control voltage receiving module further comprises:
a sixth resistor, wherein a second terminal of the sixth resistor is electrically connected to the first terminal of the third transistor.

10. The dimming circuit of claim 8, wherein a control terminal of the third transistor is configured to receive the control voltage, and a second terminal of the second transistor is configured to provide the reference voltage.

11. The dimming circuit of claim 8, wherein the control voltage receiving module further comprises:
a slope control circuit configured to control the third transistor, so as to adjust a slope of a characteristic curve of the driving current versus the control voltage.

12. The dimming circuit of claim 11, wherein the slope control circuit comprises a voltage divider circuit configured to control an electric level at a control terminal of the third transistor.

13. The dimming circuit of claim 12, wherein the voltage divider circuit comprises:
a seventh resistor, wherein a first terminal of the seventh resistor is configured to receive the control voltage, and a second terminal of the seventh resistor is electrically connected to a control terminal of the third transistor; and
an eighth resistor, wherein a first terminal of the eighth resistor is electrically connected to the second terminal of the seventh resistor, and a second terminal of the eighth resistor is electrically connected to the ground terminal.

14. The dimming circuit of claim 12, wherein the control voltage receiving module further comprises:

a voltage clamping circuit electrically connected to the voltage divider circuit, the voltage clamping circuit being configured to output a clamping voltage to the voltage divider circuit according to the control voltage such that the voltage divider circuit controls the electric level at the control terminal of the third transistor according to the clamping voltage.

15. The dimming circuit of claim 14, wherein the voltage clamping circuit comprises:
   a first voltage regulation unit configured to provide the clamping voltage; and
   a fifth transistor, wherein a first terminal of the fifth transistor is electrically connected to a first terminal of the first voltage regulation unit, and a control terminal of the fifth transistor is configured to receive the control voltage.

16. The dimming circuit of claim 15, wherein the voltage clamping circuit comprises:
   a tenth resistor, wherein a second terminal of the tenth resistor is electrically connected to the first terminal of the first voltage regulation unit.

17. The dimming circuit of claim 1, further comprises:
   a voltage adjusting module electrically connected to the control voltage receiving module and the driving module, the voltage adjusting module being configured to output a second dimming rectified voltage to the control voltage receiving module and the driving module according to a first dimming rectified voltage.

18. The dimming circuit of claim 17, wherein the voltage adjusting module comprises:
   a ninth resistor, wherein a first terminal of the ninth resistor is configured to receive the first dimming rectified voltage; and
   a second voltage regulation unit, wherein a first terminal of the second voltage regulation unit is electrically connected to a second terminal of the ninth resistor.

19. The dimming circuit of claim 18, wherein the voltage adjusting module is further configured to output the second dimming rectified voltage according to the first dimming rectified voltage and a transistor voltage, and the voltage adjusting module further comprises:
   a fourth transistor, wherein a first terminal of the fourth transistor is electrically connected to the first terminal of the second voltage regulation unit and the second terminal of the ninth resistor, a control terminal of the fourth transistor is configured to receive the transistor voltage, and a second terminal of the fourth transistor is electrically connected to the control voltage receiving module and the driving module.

20. The dimming circuit of claim 18, wherein the voltage adjusting module further comprises a second diode, the second diode being electrically connected between the ninth resistor and the second voltage regulation unit.

21. The dimming circuit of claim 17, further comprises:
   a dimmer configured to receive an AC voltage and output a dimming signal; and
   a rectifying module electrically connected to the dimmer and the voltage adjusting module and configured to output the first dimming rectified voltage according to the dimming signal.

* * * * *